United States Patent
Eker et al.

(10) Patent No.: US 6,512,420 B1
(45) Date of Patent: Jan. 28, 2003

(54) VARIABLE FREQUENCY OSCILLATOR UTILIZING SELECTIVELY COMBINED DUAL DELAY PATHS

(75) Inventors: Mehmet M Eker, Santee, CA (US); Thomas Bryan, Encinitas, CA (US)

(73) Assignee: Applied Mirco Circuits Corporation, San Diego, CA (US)

( * ) Notice: Subject to any disclaimer, the term of this patent is extended or adjusted under 35 U.S.C. 154(b) by 0 days.

(21) Appl. No.: 09/547,689

(22) Filed: Apr. 12, 2000

(51) Int. Cl.[7] .......................... H03K 5/159; H03B 27/00
(52) U.S. Cl. .............................. 331/57; 331/46; 331/49; 331/74; 327/144; 327/395; 327/274; 327/287; 327/288; 327/403
(58) Field of Search .................................. 327/266, 274, 327/287, 288, 144, 395, 403; 331/57, 46, 49

(56) References Cited

U.S. PATENT DOCUMENTS 5,192,886 A * 3/1993 Wetlaufer
6,259,326 B1 * 7/2001 Dunlop et al. .................. 331/2

* cited by examiner

*Primary Examiner*—Arnold Kinkead
(74) *Attorney, Agent, or Firm*—Gray Cary Ware & Freidenrich; Terrance A. Meador

(57) ABSTRACT

A variable frequency oscillator provides an output frequency that is adjustable by selectively combining different delay signals from separate signal paths. The present invention's oscillator includes first and second differential signal paths, each exhibiting a different time delay or "phase." Each signal path includes a series coupling of multiple delay elements, where each delay element comprises a single differential amplifier transistor pair. Each signal path's delay is established by setting the biasing and geometry of the signal paths' differential amplifier transistor pairs. A combiner, separately coupled to each signal path, selectively combines signals from the paths to provide a representative output. This output is also fed back as input to both signal paths. As an example, the combiner may be provided by two non-nested differential amplifier transistor pairs. The ratio at which the combiner combines signals from the signal paths may be changed by adjusting the biasing of the combiner's differential amplifier transistors pairs. A buffer may be coupled to the oscillator for the purpose of isolating amplifying, sampling, storing, or favorably loading the oscillator's output. In one embodiment, the buffer is coupled to the output of one of the signal paths. In another embodiment, the buffer is coupled to the output of the combiner.

12 Claims, 4 Drawing Sheets

VARIABLE FREQUENCY OSCILLATOR UTILIZING SELECTIVELY COMBINED DUAL DELAY PATHS

BACKGROUND OF THE INVENTION

1. Field of the Invention

The present invention relates to oscillator circuits. More particularly, the invention concerns a voltage controlled oscillator (VCO) providing an output frequency that is adjustable by selectively combining different phase signals from separate signal paths.

2. Description of the Related Art

Generally, a VCO is a circuit that provides an oscillating output signal, such as a square wave, whose frequency can be changed by varying a voltage input. VCOs are used in many different circuits today, such as clock recovery units, phase locked loops, and synthesizers.

Conventional VCOs utilize a number of inverters coupled in series, where each inverter also functions as a delay element. By utilizing an odd number of inverters, the last inverter's output is opposite that of the first inverter's input. By feeding the last inverter's output back to the first inverter, this creates an unstable situation and the circuit begins to oscillate. Namely, the output changes between positive and negative amplitudes in sinusoid, square wave, or rounded-corner square wave fashion.

FIG. 1 depicts one type of conventional VCO 100. The VCO 100 includes serially connected delay elements 102–104, each of which comprises a differential pair. Each delay element 102–104 receives two input signals; the differential pairs serve to invert each input signal and thereby provide a complementary pair of output signals. The dual signals are related in that they are inversely proportional, i.e., if one signal larger, the other signal should be smaller. The delay elements 102–104 provide their output signals upon lines 107–108, which are fed back to the first delay element 102. The output signals on lines 107–108 are also directed to a buffer 106, which processes the output signals by amplifying and isolating them. The final output signals appear on the lines 112, 114.

Each delay element 102–104 is coupled to common bias inputs 110, 111. The signals upon the bias inputs 110, 111 determine the delay introduced by each serial element 102–104, and hence the overall circuit's output frequency.

FIG. 2 depicts a conventional delay element 200. The circuit 200 includes dual transistors pairs, including inner transistors 202, 203 and outer transistors 206, 207. The inner transistors 202, 203 are biased by the transistor 214, and the outer transistors 206, 207 are biased by the transistor 216. The gates of the inner and outer transistors 202, 206 are coupled by a gate resistor 210. Similarly, gates of inner and outer transistors 203, 207 are coupled by a gate resistor 211.

Input signals (such as from the lines 107, 108 or a previous delay element) are directed to the outer transistors' gates 206a, 207a. The output signals of the circuit 200 appear at the nodes 206b, 207b. These output signals appear on the lines 107, 108 (in the case of the final delay element 104), or on the inputs to a subsequent delay element (in the case of earlier delay elements 102, 103). Frequency control in the circuit 200 is achieved by favoring one of the transistor pairs 202–203, 206–207 against the other.

In the circuit 200, two differential pairs share the same loads and also the same inputs. The differential pair 202–203 is slowed by the added gate resistors. The signal will favor the pair with a higher tail current. If the tail current of the differential pair 202–203 is higher than the transistors 206–207, the signal through the circuit 200 will be delayed more and the oscillation frequency will be slower. On the other hand, if the tail current of the differential pair 206–207 is higher, the signal will favor this differential pair, the delay through the circuit 200 will be shorter, and the oscillation frequency will be higher.

FIG. 3 shows a conventional buffer 300. Namely, the buffer comprises a differential amplifier with paired transistors 302, 304, a bias transistor 306, and voltage supply resistors 307, 308.

Although the foregoing circuits constitute a significant advance and enjoy some commercial success today, the assignee of the present application has continually sought to improve the performance and efficiency of available VCO circuits. Some areas of possible focus concern decreasing of noise, increasing oscillation frequency, and lowering the sensitivity of the output frequency to input changes ("VCO gain").

In this respect, the present inventors have discovered that the inherent parasitic capacitance of the transistors 202, 206 (and 203, 207) is additive because the transistors are coupled in parallel. This increased capacitance might even prevent the VCO 100 from oscillating at some higher frequencies. Additionally, the inventors have discovered that the gate resistors 210, 211 tend to act as noise sources, and due to their presence near the inputs 206a, 207a, the added noise is even more pronounced.

Consequently, conventional VCOs may not be completely adequate in all applications, especially those applications requiring particularly low noise or high frequency VCOs.

SUMMARY OF THE INVENTION

Broadly, the present invention concerns a VCO providing an output frequency that is adjustable by selectively combining different delay signals from separate signal paths. The present invention's VCO includes first and second differential delay paths, each exhibiting a different delay or "phase". Each signal path includes a series coupling of multiple delay elements, where each delay element comprises a single differential amplifier transistor pair ("differential pair"). Each signal path's time delay is adjustable by changing the biasing and geometry of the delay paths' differential amplifier transistor pairs.

A combiner, separately coupled to each delay path, selectively combines signals from the signal paths to provide a representative output. This output is also fed back as input to both signal paths. As an example, the combiner may be provided by two non-nested differential pairs. The ratio at which the combiner combines signals from the signal paths, and hence the VCO's output frequency, may be changed by adjusting the biasing of the combiner's differential pairs. Since the combiner's output signal is fed back to the delay paths, the combiner's frequency is adopted by the signal paths.

A buffer may be coupled to the VCO for the purpose of amplifying, isolating, sampling, storing, or favorably loading the VCO's output. In one embodiment, the buffer is coupled to the output of one of the signal paths. In another embodiment, the buffer is coupled to the output of the combiner.

The foregoing features may be implemented in a number of different forms. For example, one aspect of the invention comprises an apparatus, such as a VCO circuit. Another aspect involves a method to operate such a VCO circuit as shown herein.

The invention affords its users with a number of distinct advantages. Importantly, the present invention's VCO exhibits lower noise than conventional high frequency VCOs. One reason is that the delay elements utilize single pair differential amplifiers, rather than dual pair, nested differential amplifiers that tend to amplify certain types of noise. Noise is also reduced because the two signal paths are arranged in parallel, rather in series as with previous designs.

As another benefit of the invention, higher oscillation frequencies are possible because the delay elements are advantageously structured to minimize parasitic capacitance. For example, the differential amplifier structure avoids using gate resistors, and therefore avoids this possible source of noise. Furthermore, the circuit's noise is inherently less than the noise of either signal path, due to the parallel signal path arrangement. Furthermore, the invention exhibits higher signal strength at higher oscillation frequencies because, on the average, there is less loading between stages.

Still another benefit concerns signal gain. Namely, VCO gain can be adjusted by setting the delays phases of the two signal paths close to each other. Often, a lower gain is desirable to reduce jitter and increase the precision with which the output frequency can be selected. The invention also provides a number of other advantages and benefits, which should be apparent from the following description of the invention.

BRIEF DESCRIPTION OF THE DRAWINGS

FIGS. 6–7 are schematic diagrams showing the circuit components and interconnections of delay elements suitable for use in the present invention's VCO.

DETAILED DESCRIPTION

The nature, objectives, and advantages of the invention will become more apparent to those skilled in the art after considering the following detailed description in connection with the accompanying drawings.

Hardware Components & Interconnections
Overall Design

One aspect of the invention concerns a variable frequency oscillator, which may be implemented as a VCO. Although the present invention's VCO may be implemented with various details of construction, the central theme is the use of two parallel, dual signal paths of different phases, with a combiner that selectively combines signals from the two paths to provide an output signal of some desired, intermediate frequency.

Figure 4:
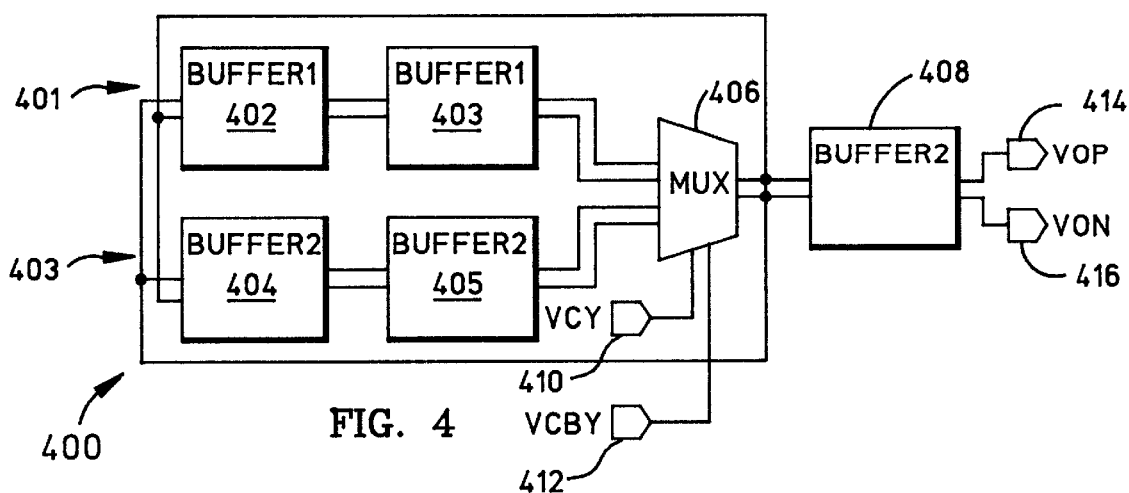
FIG. 4 is a block diagram showing the hardware components and interconnections of a first configuration of VCO according to the present invention.

FIG. 4 shows an exemplary VCO 400 that embodies the foregoing design. The VCO 400 includes a first signal path 401 (comprised of the delay elements 402, 403) and a second signal path 403 (comprised of the delay elements 404, 405). The delay elements, whose construction is further explained below, may also be referred to as "buffers" or "inverters." Each delay element receives differential input signals, and serves to amplify and introduce some prescribed time delay. The additive time delay of the delay elements 402, 403 is different than the additive time delay of the delay elements 404, 405. The signal paths 401, 403 have the same frequency, but due to the different delays, the signal paths 401, 403 have different phases.

Outputs of the signal paths 401, 403 are directed to a combiner 406, also called a "multiplexer" or "mux." The combiner 406 selectively combines signals from the paths 401, 403 to provide an output with a frequency determined by the phase difference between the signals of the paths 401, 403. The combiner 406 also feeds its output signals back as input to the signal paths 401, 403, thus, the signal paths 401, 403 and combiner output share the same frequency. Signals on biasing inputs 410, 412, dictate the ratio at which the combiner blends signals from the paths 401, 403, and hence the VCO's ultimate output frequency.

The VCO 400 also includes a buffer 408, illustrated in one possible connection. Namely, the buffer 408 is coupled to the output of the combiner 406. The VCO's output signals appear on the lines 414, 416. This arrangement may be desirable from the standpoint of noise performance.

Figure 5:
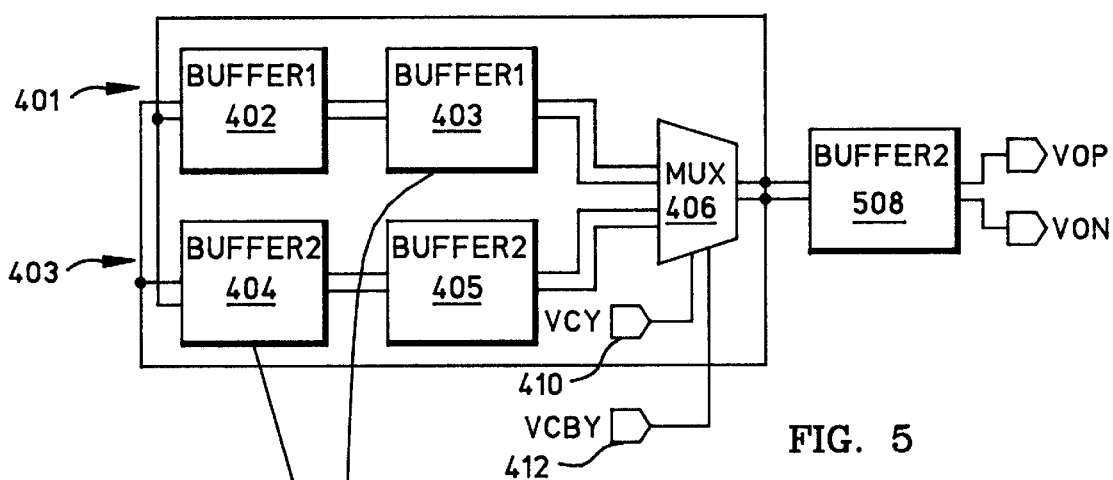
FIG. 5 is a block diagram showing the hardware components and interconnections of a second configuration of VCO according to the present invention.

FIG. 5 depicts an alternate buffer connection. Namely, instead of connecting the buffer 408 to the combiner 406 (as in FIG. 4), the arrangement of FIG. 5 provides a buffer 508 connected to the output of the signal path 401. As an alternative, the buffer 508 may be connected to the output of the signal path 403. To avoid limiting the maximum output frequency, the buffer 508 is preferably coupled to the signal path of greater time delay, i.e., the "slower" path. The arrangement of FIG. 5 may be desirable from the standpoint of reducing loading of the combiner 406.

Figures 1, 2, 3:
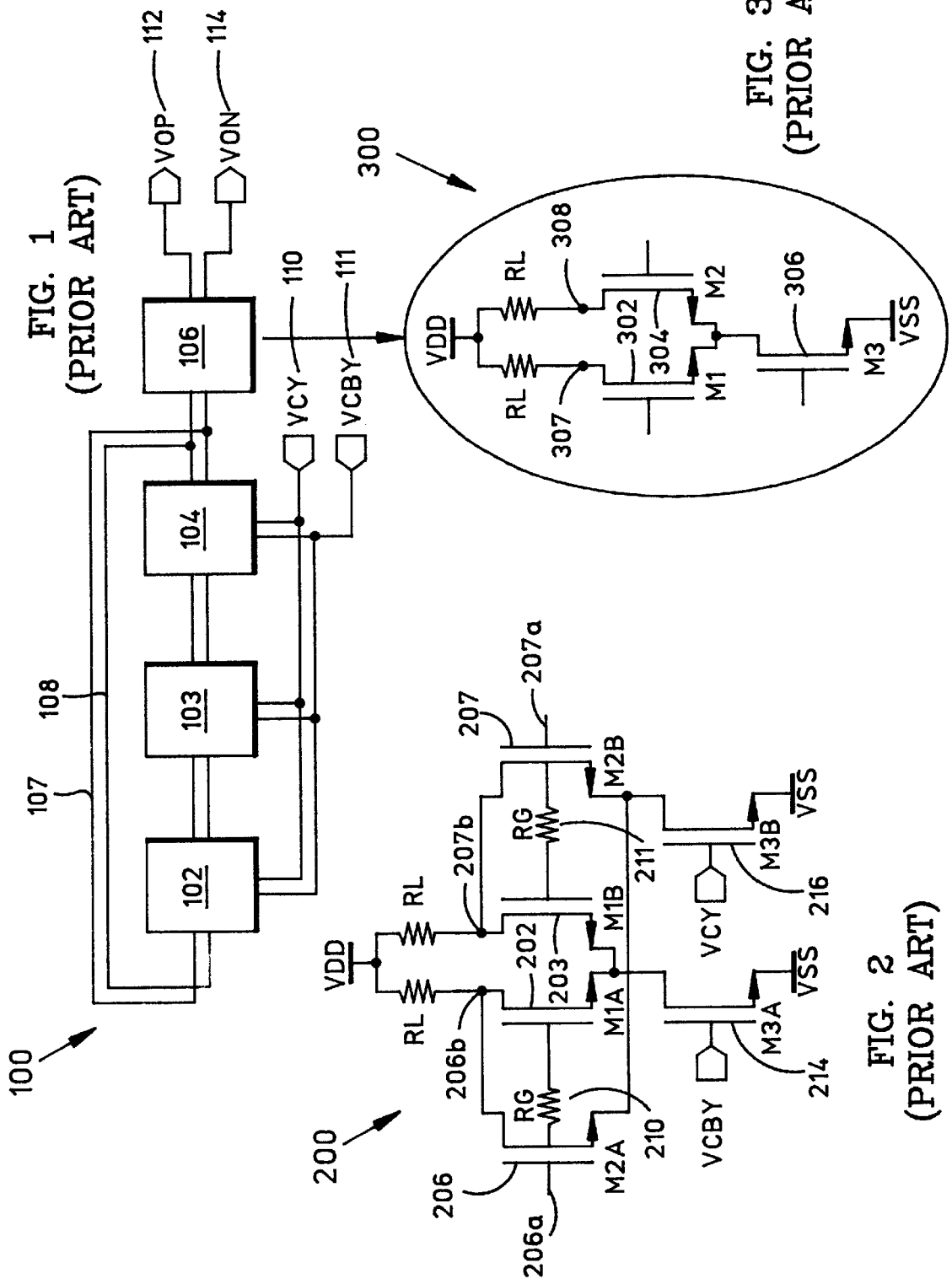
FIG. 1 is a block diagram of a conventional VCO.
FIG. 2 is a schematic diagram showing a delay element used in the conventional VCO.
FIG. 3 is a schematic diagram showing an exemplary buffer used in the conventional VCO.
Figure 6:
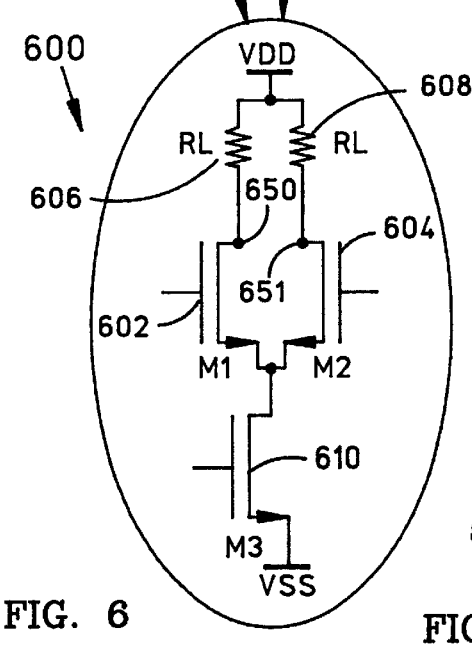

Buffer/Delay Element/Dual Signal Inverter
First Example—Single Biasing Transistor FIG. 6 illustrates one exemplary configuration of delay element. Namely, the delay element 600 utilizes transistors 602, 604 configured to operate as a differential pair. Unlike the conventional delay element 200 of FIG. 2, the structure 600 utilizes a single-stage differential amplifier transistor pair. Other components include load resistors 606, 608 and a biasing ("tail") transistor 610. The gates of the transistors 602, 604 serve as the differential inputs of the delay element 600 represented by this differential pair, whereas the transistors' drains provide differential outputs at 650, 651. The circuit 600 inverts each input signal at its corresponding output, e.g., the input at the gate of the transistor 602 appears inverted at the same transistor's drain 650. The signal at the gate of the biasing transistor 610 dictates the delay introduced by the element 600.

Second Example—Multiple Biasing Transistors

FIG. 7 illustrates a different configuration of delay element. Namely, the delay element 700 utilizes four transistors 702, 703, 704, 705 configured to operate as a differential pair. Unlike the conventional delay element of FIG. 2, the structure 700 does not use any nested transistors pairs. Rather than being nested, the transistor pairs 702–703 and 704–705 are provided in a stacked configuration. The lower transistors 704, 705 act as biasing transistors for the upper transistors 702, 703. The lower transistors' gates are connected. Other components include load resistors 708, 709.

The gates of the transistors 702, 703 serve as the differential inputs of the delay element represented 700, whereas the transistors' drains provide outputs at 750, 751. The circuit 700 inverts each input signal at its corresponding differential output, e.g., the input at the gate of the transistor 702 appears inverted at the same transistor's drain 750. The "biasing" signal at the interconnected gates of the biasing transistors 704, 705 dictates the delay introduced by the element 700.

Combiner

First Example—Single Biasing Transistor

Figure 8:
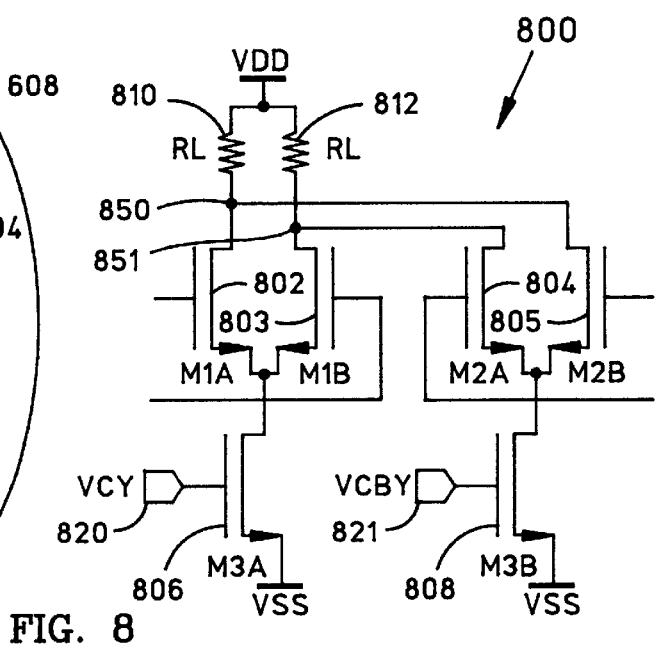
FIGS. 8–10 are schematic diagrams showing the circuit components and interconnections of various combiners suitable for use in the present invention's VCO.

FIG. 8 illustrates one exemplary configuration of combiner. Namely, the combiner circuitry 800 utilizes two differential amplifier pairs 802–803 and 804–805, where the pairs utilize respective biasing transistors 806, 808. Other components include load resistors 810, 812. Each transistor's drain is coupled to the drain of a different transistor from the other pair at nodes 850, 851. For example, the drains of the transistors 802, 805 are connected at the node 850.

The gates of the transistors 802, 803 receive the differential outputs from one signal path (such as 401), whereas the gates of the transistors 804, 805 receive differential outputs from the other signal path (such as 403). The differential output of the circuit 800 appears at the nodes 850, 851. The circuit 800 combines its input signals in a ratio dictated by signals on biasing inputs 820, 821. As discussed in greater detail below, the signals provided on the biasing inputs 820, 821 are inversely proportional to each other, i.e., larger signals on one input require small signals on the other input.

Second Example—Common Gate Dual Biasing Transistors

Figure 9:
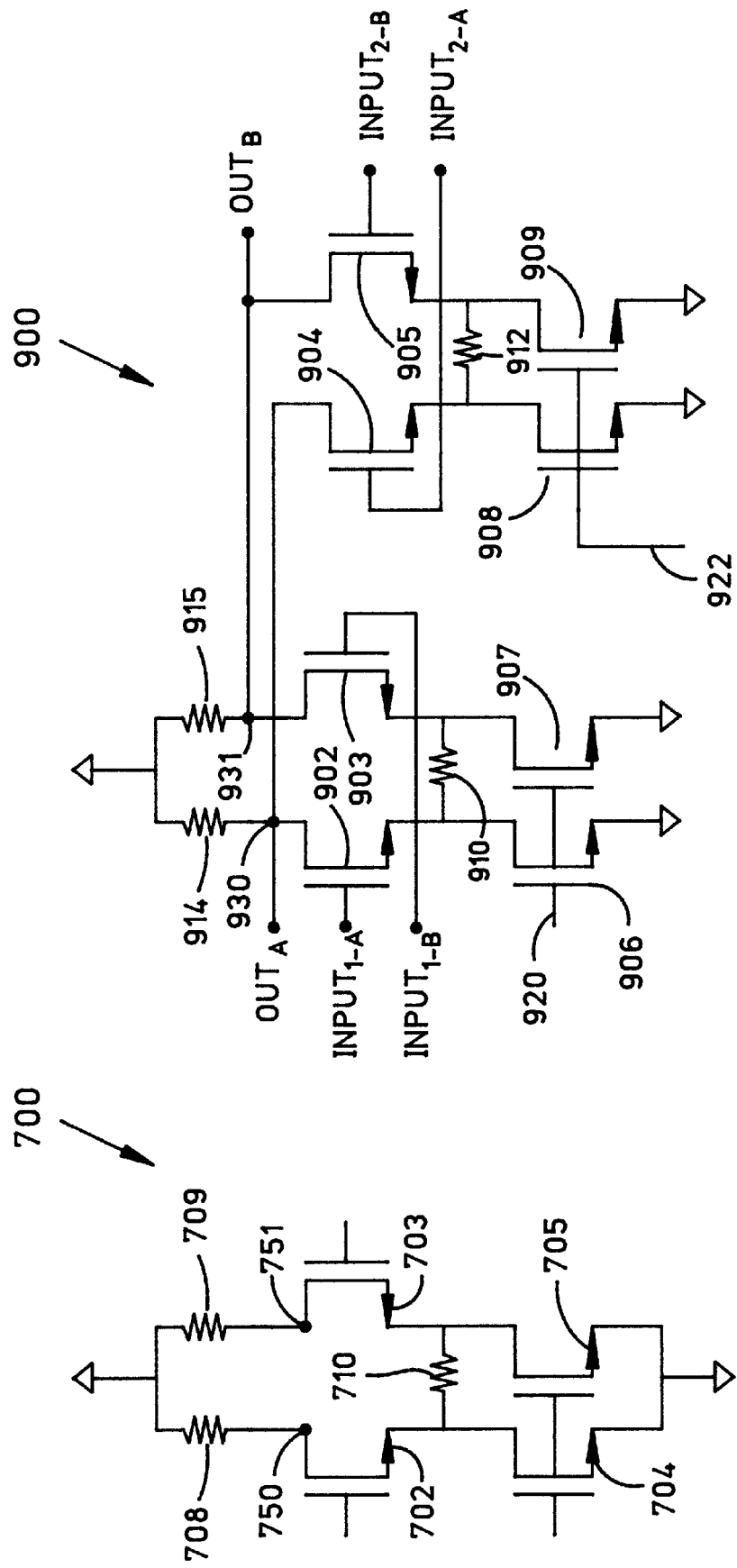

FIG. 9 illustrates a different configuration of combiner. The combiner circuitry 900 utilizes two differential pairs 902–903 and 904–905, which utilize respective pairs of biasing transistors 906–907 and 908–909. In the differential pairs, each transistor's drain is coupled to the drain of a different transistor from the other pair at nodes 930, 931. For example, the drains of the transistors 902, 904 are connected at the node 930. Other components include load resistors 914, 915 and source degeneration resistors 910, 912.

The gates of the transistors 902, 903 receive differential outputs from one signal path (such as 401), whereas the gates of the transistors 904, 905 receive differential outputs from the other signal path (such as 403). The differential output of the circuit 900 appears at the nodes 930, 931. The circuit 900 combines its input signals in a ratio dictated by signals on biasing inputs 920, 922. As discussed in greater detail below, the signals provided on the biasing inputs 920, 922 are inversely proportional to each other, i.e., larger signals on one input require small signals on the other input.

Third Example—Independent Gate Dual Biasing Transistors

Figure 10:
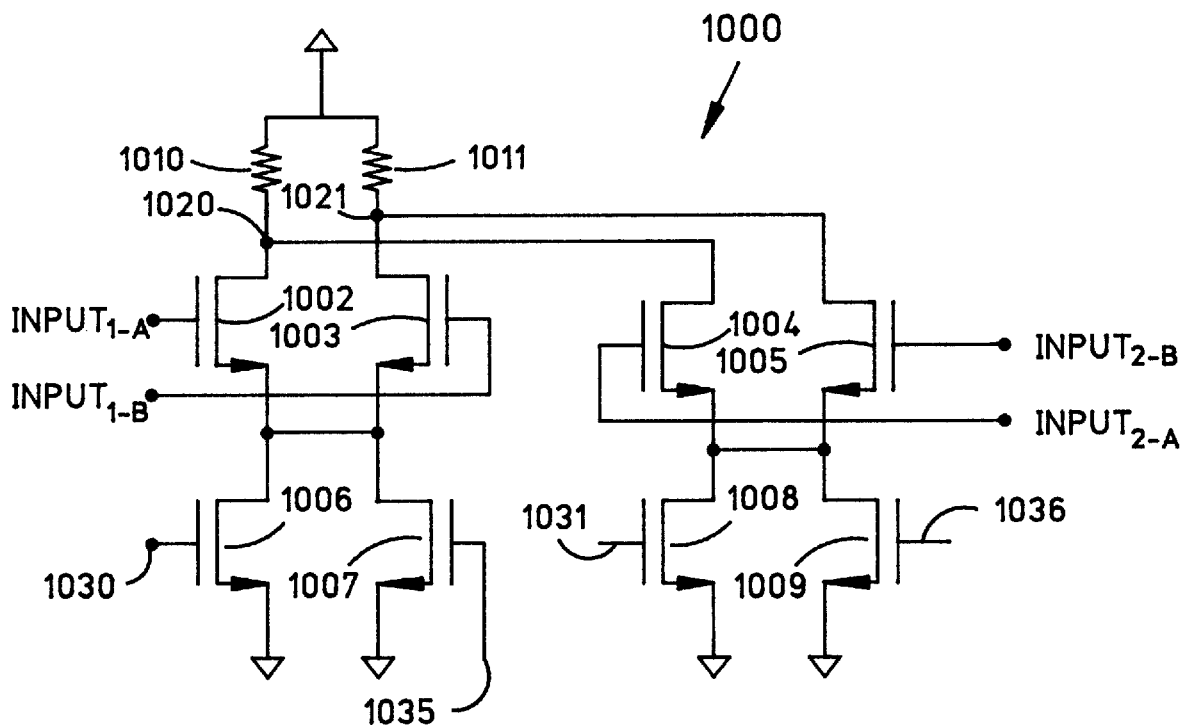

FIG. 10 illustrates still another configuration of combiner. The combiner circuitry 1000 utilizes two differential amplifier pairs 1002–1003 and 1004–1005, which utilize respective pairs of biasing transistors 1006–1007 and 1008–1009. In the differential amplifier pairs, each transistor's drain is coupled to the drain of a different transistor from the other pair at nodes 1020, 1021. For example, the drains of the transistors 1002, 1004 are connected at the node 1020. Other components include load resistors 1010, 1011.

The gates of the transistors 1002, 1003 receive differential outputs from one signal path (such as 401), whereas the gates of the transistors 1004, 1005 receive differential outputs from the other signal path (such as 403). The dual output of the circuit 1000 appears at the nodes 1020, 1021. The circuit 1000 combines its input signals in a ratio dictated by signals on biasing inputs 1030–1031 and 1035–1036. Namely, the signals on the biasing inputs 1030, 1031 act to set the combining ratio, whereas the signals on the biasing inputs 1035, 1036 are fixed. The signals provided on the biasing inputs 1030, 1031 are inversely proportional to each other, i.e., larger signals on one input require small signals on the other input. The signals provided on the biasing inputs 1031–1036 are fixed because they ensure that each differential pair will always conduct large enough current to stay out of its sub-threshold region.

Operation

In addition to the various hardware embodiments described above, a different aspect of the invention concerns a method for operating a variable frequency oscillator, such as the different embodiments of oscillator shown above.

Introduction

Figure 11:
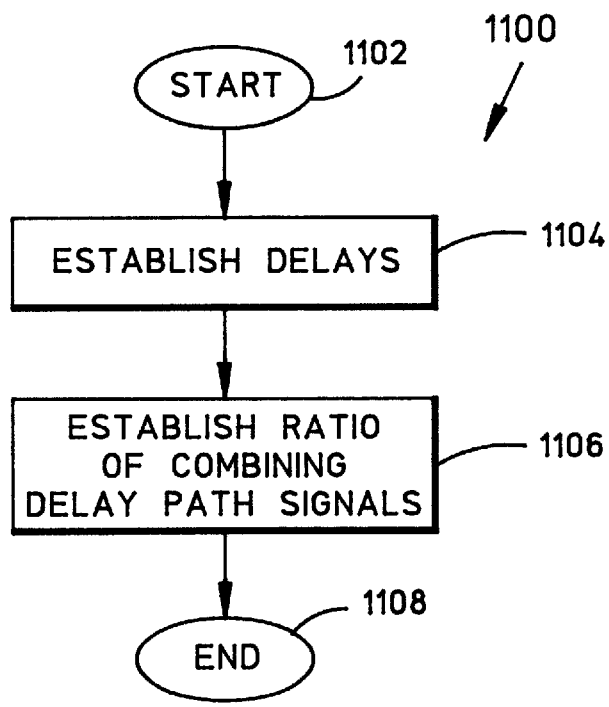
FIG. 11 is a flowchart depicting an illustrative operating sequence for a variable frequency oscillator according to this invention.

In this respect, FIG. 11 depicts an illustrative sequence 1100 for operating a variable frequency oscillator. For ease of explanation, but without any intended limitation, the example of FIG. 11 is described in the context of the oscillator 400 described above (FIG. 4). The actions of FIG. 11 may be performed by manual application of voltage, or more conveniently by constructing circuit elements to provide the required voltage levels.

Establishing Delays

After the sequence 1100 begins in step 1102, step 1104 establishes the phases of the delay paths 401, 403. This is achieved by configuring the delay elements 402–405. In the case of the delay element 600 (FIG. 6), step 1104 involves (1) driving the bias transistor 610 to bias the transistors 602, 604 appropriately, and also (2) establishing the geometry of the differential pair 600. The delay element 600 will produce a greater delay if the bias signal at the gate of the transistor 610 is small and the size of the pair transistors and the value of the load resistors are large. Conversely, the delay element 600 will produce a shorter delay if the bias signal at the gate of the transistor 610 is large, and the size of the pair transistors and the value of the load resistors are small.

In the case of the delay element 700 (FIG. 7), step 1104 involves driving the bias transistors 704–705 to bias the transistors 702, 703 appropriately, and also setting the geometry of the circuit 700. The time delay introduced by the delay element 700 varies in proportion to the voltage of the bias signal at the common gates of the transistors 704–705. For example, the delay element 700 will produce a longer delay when bias signal at the common gates of the transistors 704–705 is small, the size of the pair transistors and the value of load resistors are large.

Establishing Ratio of Combining Delay Paths Signals

After step 1104, step 1106 establishes the ratio of combining signals from the delay paths 401, 403. This is achieved by configuring the combiner 406. The biasing voltages at the bias inputs 410, 412 determine the summing ratio of the combiner 406. One of the bias inputs corresponds to the fast signal path, and the other input corresponds to the slow path. If the voltage at the fast-path bias input is greater than the slow-path bias input, the combiner 400 will favor the fast path signal and limit the slow path signal. The fast path signal will pass through the combiner 406 more freely, resulting in a higher oscillation frequency. The maximum oscillation frequency is achieved when the fast path signal is passed and the slow path signal is blocked completely. This is achieved by setting one of the bias inputs 410, 412 to (Vc) max and the other one of the bias inputs 410, 412 to (Vc) min. Conversely, the minimum oscillation frequency is achieved when the slow path signal is passed and the fast path signal is blocked completely. Any bias condition in between these values will result in oscillation frequency between these maximum and minimum frequencies.

Advantageously, the "VCO gain" can be adjusted by setting the phases of the signal paths 401, 403 close together. This is because the maximum oscillation frequency is set by the faster path delay, and the minimum oscillation frequency is set by the slower path delay. Setting these two delay close to each other yields a small separation between the maximum oscillation frequency and the minimum oscillation frequency over the same range of biasing voltages. If this range of biasing voltages is fixed, such as by power supply or transistor characteristics, lower values of VCO gain are provided by more closely spaced min/max signal path frequencies.

To discuss the biasing of the combination 406 in greater detail, several examples are given as follows. In the case of the combiner 800 (FIG. 8), step 1106 involves setting the magnitude of the variable-bias signals on the bias inputs 820, 821. To make the combiner 800 generate a signal with greater weight to one signal path over the other, the signal on the bias input corresponding to that signal path is increased and other bias signal is decreased. For example, if the transistor 802 is coupled to the signal path 401, increasing the bias input 820 will increase the ratio of the signal path 401 to the signal path 403 in the combiner's output. In the case of the combiner 900 (FIG. 9), step 1106 involves adjusting input signals on the lines 920, 922 in similar fashion as described above in the context of FIG. 8.

In the case of the combiner 1000 (FIG. 10), step 1106 involves setting the voltage of the bias input signals at 1030–1031 and 1035–1036. More particularly, fixed magnitude signals are applied to the inputs 1035–1036, which have the effect of continuously biasing the differential pairs to keep them out of the sub-threshold regions. In contrast to the fixed magnitude signals at 1035–1036, variable signals are input at 1030–1031, which have the effect of changing the combining ratio, and therefore the frequency. To make the combiner 1000 generate a signal with greater weight to one signal path over the other, the signal on the bias input corresponding to that signal path is increased and other bias signal is decreased. For example, if the transistors 1002–1003 are coupled to the signal path 401, increasing the voltage at 1030 will increase the ratio of the signal path 401 to the signal path 403 in the combiner's output. After step 1106, the routine ends in step 1108.

Other Embodiments

While the foregoing disclosure shows a number of illustrative embodiments of the invention, it will be apparent to those skilled in the art that various changes and modifications can be made herein without departing from the scope of the invention as defined by the appended claims. As a specific example, some or all of the illustrated metal oxide semiconductor field effect transistors (MOSFETs) may be replaced with bipolar junction transistors (BJTs) instead.

Furthermore, although elements of the invention may be described or claimed in the singular, the plural is contemplated unless limitation to the singular is explicitly stated. Additionally, ordinarily skilled artisans will recognize that operational sequences must be set forth in some specific order for the purpose of explanation and claiming, but the present invention contemplates various changes beyond such specific order.

What is claimed is:

1. A variable frequency oscillator, comprising:
    faster and slower differential apparatus signal paths, the signal paths producing differential output signals exhibiting different phases; and
    a combiner coupled to each signal path to selectively combine output signals from the signal paths and provide a representative combined output signal, and feed the combined output signal back as input to the faster and slower signal paths.

2. The apparatus of claim 1, each differential signal path comprising:
    multiple delay elements coupled in series, each delay element comprising a differential amplifier transistor pair.

3. The apparatus of claim 1, each differential signal path comprising:
    a series coupling of multiple delay elements, each delay element comprising an inverter.

4. The apparatus of claim 1, further comprising:
    a buffer coupled to the combiner to receive the combined output signal.

5. The apparatus of claim 1, further comprising:
    a buffer coupled to one of differential signal paths.

6. The apparatus of claim 1, the combiner comprising:
    two non-nested differential amplifier transistor pairs.

7. The apparatus of claim 6, where:
    each of differential amplifier transistor pairs comprises:
        first and second upper MOSFETs having drains electrically connected to a power source via separate load resistors, and having sources electrically interconnected via a resistor; and
        first and second lower MOSFETs having respective drains electrically connected to sources of the upper MOSFETs, having gates electrically interconnected, and having sources electrically connected to an electrical ground; and
    where each drain of an upper MOSFET in the one differential amplifier transistor pair is electrically connected to a drain of a different upper MOSFET in the other differential amplifier transistor pair.

8. The apparatus of claim 6, where:
    each of the first and second differential amplifier transistor pairs comprises:
        first and second upper MOSFETs having drains electrically connected to a power source via separate load resistors, and having sources electrically interconnected; and
        first and second lower MOSFETs having respective drains electrically connected to drains of the upper MOSFETs, and having drains electrically connected to an electrical ground; and
    where each drain of an upper MOSFET in the one differential amplifier transistor pair is electrically connected to a drain of a different upper MOSFET in the other differential amplifier transistor pair.

9. A voltage controlled oscillator, comprising:
    a first differential signal path having a first differential input and a first differential output, and providing signals at the first differential output of a first phase;
    a second differential signal path having a second differential input and a second differential output, and providing signals at the second differential output of a second phase;

a combiner having first and second combiner differential inputs and a combiner differential output, the first combiner differential input coupled to the first differential output, the second combiner differential input coupled to the second differential output, the combiner differential output coupled to the first and second differential inputs, the combiner selectively combining the first and second differential outputs in a ratio indicated by one or more combiner biasing inputs to provide a signal combiner output at the combiner differential output, the combiner differential output signal having a frequency that is proportional to the ratio.

10. A variable frequency oscillator, comprising:

first differential signal path means for producing a differential output signal with a first delay;

second differential signal path means for producing a differential output signal with a second delay;

combiner means, coupled to each signal path means, for selectively combining in differential output signals from the signal path means to provide a combined output signal having a frequency determined by a ratio of the selective combining of differential output signals, and feeding the combined output signal back as input to the first and second signal path means.

11. A method for operating a variable frequency oscillator, comprising operations of:

providing a variable frequency oscillator including:

first and second differential signal paths, each signal path producing a differential output signal with a different phase, where each signal path comprises a series coupling of multiple delay elements, each delay element comprising a differential amplifier transistor pair;

a combiner including multiple differential amplifier transistor pairs electrically connected to each signal path and configured to selectively combine signals from the signal paths and provide a representative output, and feed the representative output back as input to the first and second signal paths;

biasing the oscillator, comprising:

establishing the signal paths' phases by adjusting biasing of the signal paths' differential amplifier transistor pairs;

establishing a ratio at which the combiner combines signals from the signal paths by adjusting biasing of the combiner's differential amplifier transistor pairs.

12. A method of claim 11, the operations further comprising:

biasing the combiners' differential amplifier transistor pairs to ensure that the differential amplifier transistor pairs conduct sufficient current to operate outside a sub-threshold region.

* * * * *